United States Patent [19]
Harada

[11] Patent Number: 4,684,763
[45] Date of Patent: Aug. 4, 1987

[54] HERMETICALLY SEALABLE PACKAGE FOR ELECTRONIC COMPONENT

[75] Inventor: Saburo Harada, Tokyo, Japan

[73] Assignee: Koto Electric Co., Ltd., Urawa, Japan

[21] Appl. No.: 738,665

[22] Filed: May 28, 1985

[30] Foreign Application Priority Data

May 28, 1984 [JP] Japan .................................. 59-108156
May 1, 1985 [JP] Japan .................................. 60-94202

[51] Int. Cl.$^4$ .................................................. H05K 5/04
[52] U.S. Cl. .................................. 174/52 FP; 219/93
[58] Field of Search .......................... 174/52 FP, 52 H; 357/74; 219/93

[56] References Cited

U.S. PATENT DOCUMENTS 2,880,383  3/1959  Taylor ............................ 174/52 FP
3,252,060  5/1966  Marino et al. ..................... 174/52 H
3,534,233  10/1970  Long .................................. 357/74

Primary Examiner—A. T. Grimley
Assistant Examiner—David A. Tone
Attorney, Agent, or Firm—Frishauf, Holtz, Goodman & Woodward

[57] ABSTRACT

A hermetically sealable package for electronic component comprising a metallic base member and a metallic lid member, in which the metallic base member has lead wires penetrating therethrough under insulation. The base member or lid member is provided on its periphery with a protrusion for welding. The protrusion can be terraced. The sealing can be made by an independently prepared sealing member to be inserted between the sealing area of the base member and the sealing area of the lid member. The protrusion or the sealing member can be prepared by an etching technology.

5 Claims, 14 Drawing Figures

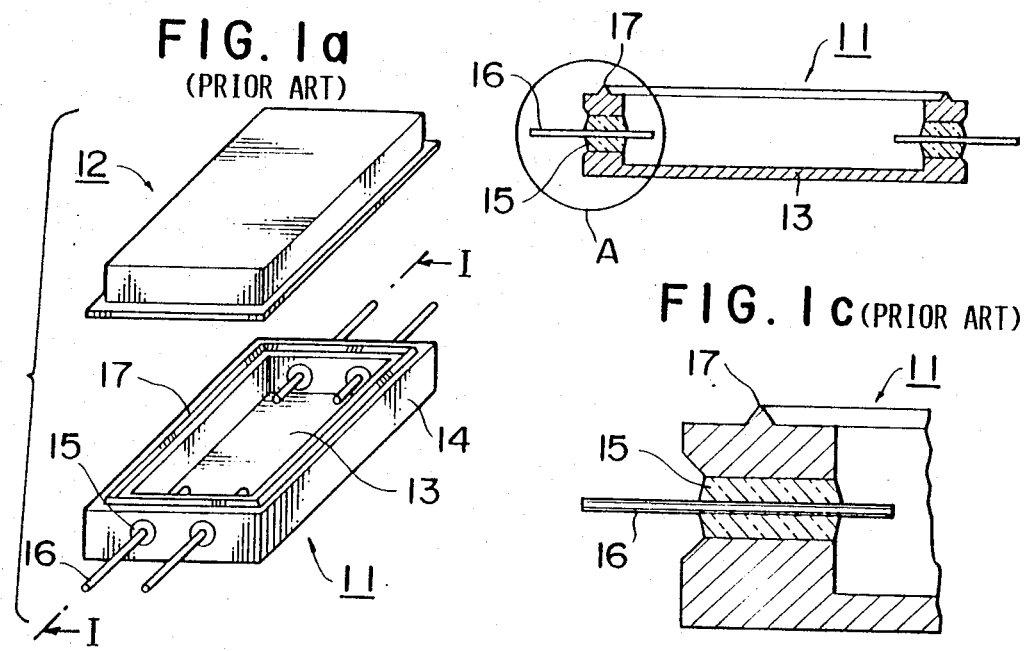
FIG. 1a (PRIOR ART)
FIG. 1b (PRIOR ART)
FIG. 1c (PRIOR ART)
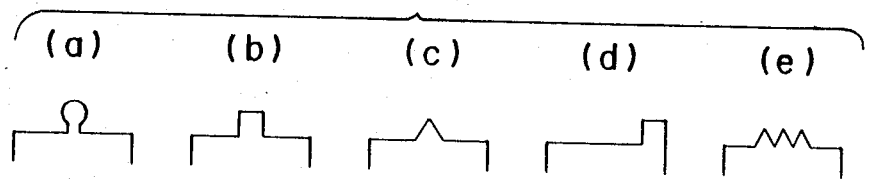
FIG. 2
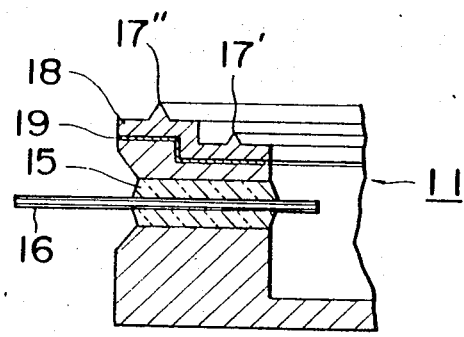
FIG. 3

HERMETICALLY SEALABLE PACKAGE FOR ELECTRONIC COMPONENT

BACKGROUND OF THE INVENTION

1. Field of the invention

This invention relates to a hermetically sealable package for electronic component. More particularly, the invention relates to a hermetically sealable package for appropriately sealing a functional device such as an electronic circuit for high frequency region provided on an alumina substrate in the form of a thick or thin layer hybrid integrated circuit, an elastic surface wave element provided in layers on a high dielectric material for high frequency, or a filter.

2. Description of prior arts

Certain electronic components such as an electronic circuit for high frequency region provided on an alumina substrate in the form of a thick or thin layer hybrid integrated circuit, an elastic surface wave element provided in layers on a high dielectric material for high frequency, a filter, and other functional devices are generally encased in a hermetically sealed package for the purpose of maintaining their functions stably for a long period.

For instance, a package illustrated in FIG. 1a in the attached drawings is employed. In FIG. 1a, the package is composed of a base member 11 and a lid member 12. The base member 11 comprises a bottom plate 13 and a side wall 14 which extends upwardly from the periphery of the bottom plate 13. The bottom plate 13 and side wall 14 are generally made of metal such as iron or an alloy. The side wall 14 is provided with insulating portions 15, through which lead wires 16 penetrate. The insulating portion 15 is generally made of glass. The top of the wall 14 is to be welded with the periphery of the lid member 12 to seal the package. On the top of the wall 14 is formed a protrusion 17 for facilitating the welding. The welding is generally performed through resistance welding. FIG. 1b is a vertical section of the base member of the package illustrated in FIG. 1a, which is taken along the line I—I. As shown in FIG. 1b as well as in FIG. 1c which is an enlarged view of the portion A of FIG. 1b, the protrusion 17 has a pointed top.

As described above, the protrusion is formed on the base member for facilitating the welding between the base member and the lid member. Alternatively, the protrusion can be formed on the periphery of the lid member.

Within the base member, a functional device such as an electronic component mounted on an alumina substrate is fixed under connection with the lead wires through an electric conductive thread such as a gold or aluminum thread.

As described hereinbefore, the functional device should work sufficiently reliably even under severe conditions. For this reason, the device is hermetically sealed within the package, for instance, by welding the base member to the lid member through resistance welding in vaccum or under dry nitrogen atmosphere. In the welding operation, the applied energy is concentrated on the protrusion so that the top of the protrusion on the base member in contact with the periphery of the lid member is fused to hermetically seal both members.

Until now, the protrusion is formed on either of the members by physical processing such as stamping. For performing the stamping of a metallic sheet to form the protrusion, a fine mold is necessarily employed, and naturally the manufacture of the fine mold is very expensive. Therefore, the heretofore employed process for the preparation of the hermetically sealable package is disadvantageous in the manufacturing cost, and is not appropriate for manufacturing a small number of products. Moreover, the stamping is not appropriate for forming a protrusion having a ridgeline of even height. Accordingly, the sealing is sometimes not attained satisfactorily, and the product yield is not sufficiently high.

In the manufacture of a highly integrated electronic circuit for the use in a high frequency region or other functional devices, the quality check is generally performed in the form of a final product after providing the complete sealing. Heretofore, it has been noted that quite a few of the final products do not show the desired characteristics. The disqualified product can be converted to a qualified product by adjustment of the time constant or exchange of certain functional parts. However, the lid member of the conventional package is not exchangeable after fixation to the base member. Accordingly the above-mentioned adjustment or exchange is not effective in enhancing the production yield.

SUMMARY OF THE INVENTION

The present invention has an object to provide a hermetically sealable package for enclosing an electronic component therein.

The invention has another object to provide a package for electronic component which is hermetically sealable with high reliability.

The invention has a further object to provide a hermetically sealable package for an electronic component which can be easily and inexpensively manufactured.

There is provided by the present invention a hermetically sealable package for electronic component comprising a metallic base member and a metallic lid member, the metallic base member having lead wires penetrating therethrough under insulation, which is characterized in that the base member or lid member is provided on its periphery with a protrusion for welding which is formed by etching.

The invention further provides a hermetically sealable package for electronic component comprising a metallic base member and a metallic lid member, the metallic base member having lead wires penetrating therethrough under insulation, which is characterized in that the base member or lid member is provided on its periphery with a terraced protrusion for welding.

The invention still further provides a hermetically sealable package for electronic component comprising a metallic base member having lead wires penetrating therethrough under insulation, a metallic lid member, and a sealing member to be inserted between the sealing area of the base member and the sealing area of the lid member, the sealing member being provided with a protrusion on its upper and lower sides.

BRIEF DESCRIPTION OF THE DRAWINGS

FIG. 1a is a schematic view of a typical hermetically sealable package for enclosing an electronic component.

FIG. 1b is a section of the package illustrated in FIG. 1 which is taken along the I—I line.

FIG. 1c is an enlarged view of the portion A indicated in FIG. 1b.

FIG. 2 is a schematic view showing examples of the shape of protrusion to be provided on a sealing portion.

FIG. 3 is a schematic sectional view showing another example of the protrusion.

DETAILED DESCRIPTION OF THE INVENTION

Figure 4:
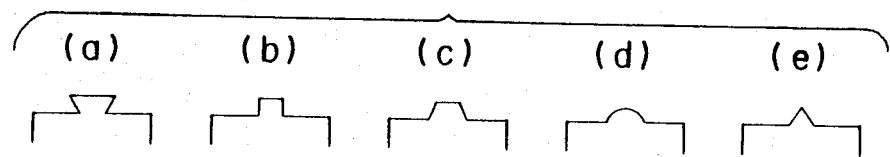
FIG. 4 is a schematic view showing examples of the shape of protrusion prior to the formation of the terraced protrusion.

In one aspect, the present invention is characterized in that the protrusion is prepared by etching. For instance, the periphery of metallic base member (e.g., top surface of the wall of the base mamber) is initially coated by a photo-resist and exposed to radiation through a photomask having a window in a portion corresponding to area to be kept from being etched. The photo-resist is then developed to remove an unhardened portion. The base member is processed in an appropriate etching solution such as dilute hydrochloric acid. Thus, the exposed portion is etched to remove a portion of the metal until the desired dimension of the protrusion is formed. By utilizing the etching process, the protrusion can be produced to have an optimal form. For instance, the protrusion having a section illustrated in FIG. 2(a), (b), (c), (d) or (e) can be produced by varying the nature and dimension of the photo-resist and the shape of the photomask. Moreover, the etching process enables production of clear-cut protrusion such as a protrusion having a ridgeline of accurately even height. Further, the etching process is advantageously employed not only in a small scale manufacturing but also in a mass scale manufacturing.

Although an embodiment in which the protrusion is provided on the base member of the package is described above, it should be understood that the protrusion can be provided on the lid member of the package. The above-described process for the formation of the protrusion on the base member can be applied to the formation of the protrusion on the lid member.

The protrusion can be prepared independently of the base member and lid member. The independently prepared protrusion member can be fixed to the sealing portion of the member, such as the periphery of the member by the use of a solder. The protrusion can be made of a metal material being the same as or different from the material of the base or lid member.

The protrusion can be composed of two or more protruded portions which are arranged to have the same height as illustrated in FIG. 2 (a)-(e). Otherwise, the two or more protrusions can be arranged in such a manner that the top of the protrusions is different in height from each other, as illustrated in FIG. 3.

In FIG. 3, the numerals have the same meanings as in FIGS. 1a, 1b and 1c. In this embodiment, the protrusion is independently prepared in the form of a protrusion member 18 having two protruded portions 17', 17" on the upper surface. The protrusion member 18 is fixed to the top of the wall of the base member by the use of a solder 19. The protrusions 17', 17" have different heights from each other. The protrusion 17' arranged on the inner side has a height lower than that of the protrusion 17" arranged on the outer side.

The base member of FIG. 3 can be employed in the following manner.

A temporary covering plate (false lid) is fixed to the inner protrusion 17' to seal the base member in which an electronic component is mounted. The sealed electronic component is then tested for confirming that the component works satisfactorily. Upon confirming that the expected characteristics are shown, the lid member is then fixed to the outer protrusion 17" to give a finally sealed package. If it is observed that the electronic component does not function satisfactorily under the preliminary sealing, the preliminary sealing is broken and the malfunctioning portion is mended. Subsequently, the lid member is fixed on the base member via the outer protrusion 17". According to the above-stated process using the embodiment illustrated in FIG. 3, the production yield in the manufacture of a highly integrated high frequency electronic circuit is surprisingly enhanced. Naturally, the production cost is significantly reduced.

In another aspect, the hermetically sealable package of the present invention is characterized in that the base member or lid member is provided on its periphery with a terraced protrusion for welding. The terraced protrusion (or protrusion arranged in tiers) is remarkably favorable for resistance welding. It can be understood that the top portion of the terraced protrusion is very advantageous to give a coherent heat spot and thus the fixing under fusion is attained more easily and perfectly.

The terraced protrusion is advantageously prepared utilizing an etching technology.

For instance, a primary protrusion having such a section as illustrated in FIG. 4 (a), (b), (c), (d) or (e) is formed. The primary protrusion can be preferably formed by an etching technology. Alternatively, the primary protrusion can be prepared by the conventional methods such as stamping, laser processing, etc. The primary protrusion is then processed to give a terraced portion. This processing is preferably performed by etching. This etching can be done in the same manner as described hereinbefore.

Figure 5:
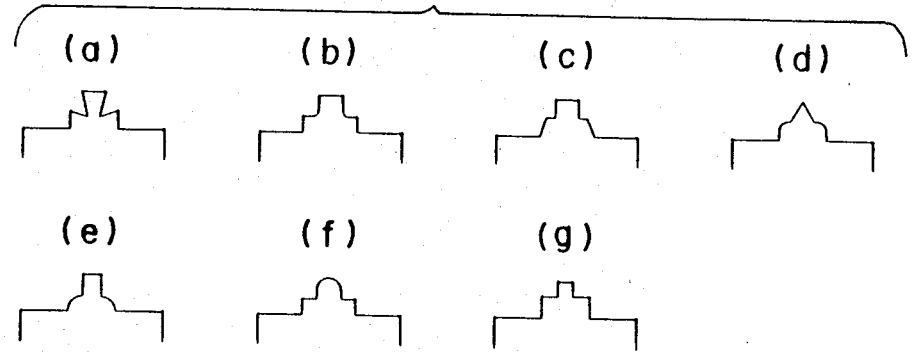
FIG. 5 is a schematic view showing examples of the shape of the terraced protrusion.

The terraced protrusion can be shaped to have a section illustrated in FIG. 5 (a), (b), (c), (d), (e), (f) or (g).

Figure 6:
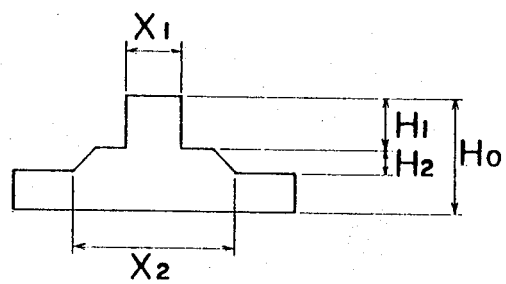
FIG. 6 is given to indicate a preferable shape and dimension of the terraced protrusion.

There is no specific limitation on the shape and dimension of the terraced protrusion. However, the shape illustrated in FIG. 6 and the dimensions given in Table 1 can be preferred.

TABLE 1

| Sample | $H_0$ | $H_2$ | $H_1$ | $X_1$ | $X_2$ |
| --- | --- | --- | --- | --- | --- |
| 1 | 0.40 | 0.24 | 0.10 | 0.10 | approx. $3X_1$ |
| 2 | 0.40 | 0.24 | 0.15 | 0.10 | approx. $3X_1$ |

TABLE 1-continued

| Sample | $H_0$ | $H_2$ | $H_1$ | $X_1$ | $X_2$ |
| --- | --- | --- | --- | --- | --- |
| 3 | 0.40 | 0.24 | 0.20 | 0.10 | approx. $3X_1$ |

According to experiments using protrusion members of Kovar alloy (Fe-Ni-Co alloy) which had the dimensions set forth in Table 1, it was confirmed by microscopic observation on the section the pointed top of all samples were well fused to fix to the lid member.

In this embodiment, the protrusion can be composed of two or more protruded portions having different height as described hereinbefore.

Figure 7:
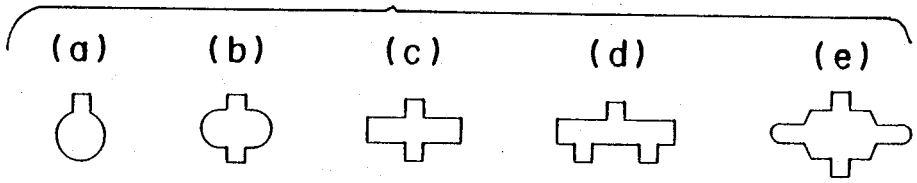
FIG. 7 is a schematic view showing, in section, examples of the shape of the separately prepared sealing member.

The protrusion member can be formed as a sealing member having a protrusion on its upper and lower sides, as illustrated in FIG. 7 (a), (b), (c), (d) or (e). The protrusion of the sealing member can be terraced.

Figure 8:
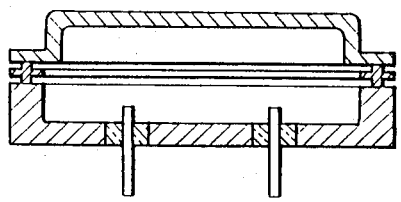
FIG. 8 is a schematic section of a package of the invention containing the sealing member.

The sealing member is inserted between the sealing portion of the base member and the sealing portion of the lid member, as illustrated in FIG. 8.

Figure 9:
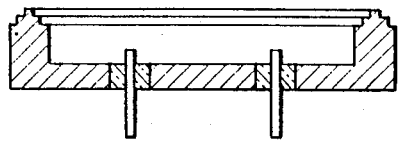
FIG. 9 is a schematic section of a base member of a package of the invention in which the protrusion is directly formed on the periphery of the base member.
Figure 10:
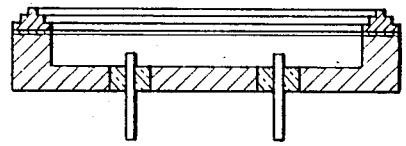
FIG. 10 is a schematic section of a base member of a package of the invention in which a separately prepared protrusion is fixed to the periphery of the base member.

FIG. 9 and FIG. 10 are given to show schematic views of a base member of a package of the invention. In the embodiment of FIG. 9, the terraced protrusion is directly formed on the periphery of the base member, while in the embodiment of FIG. 10, the separately prepared terraced protrusion is fixed to the periphery of the base member.

Figure 11:
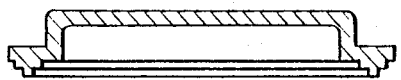
FIG. 11 is a schematic section of a lid member of a package of the invention in which the protrusion is directly formed on the periphery of the lid member.
Figure 12:
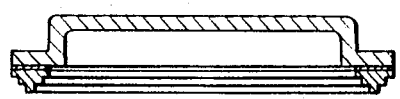
FIG. 12 is a schematic section of a lid member of a package of the invention in which a separately prepared protrusion is fixed to the periphery of the lid member.

FIG. 11 and FIG. 12 are given to show schematic views of a lid member of a package of the invention. In the embodiment of FIG. 11, the terraced protrusion is directly formed on the periphery of the lid member, while in the embodiment of FIG. 12, the separately prepared terraced protrusion is fixed to the periphery of the lid member.

It has been confirmed that the protrusion provided by the present invention effectively gives reliable sealing to the package. If the etching technology is utilized, the package can be manufactured at a relatively low cost, regardless of a mass scale production or a small scale production. Moreover, the sealing using the protrusion of the invention is economically performed because the protrusion of the shape given by the present invention requires relatively low energy for the welding.

I claim:

1. A hermetically sealable package for electronic component comprising a metallic base member and a metallic lid member, the metallic base member having lead wires penetrating therethrough wrapped in insulation, wherein the base member or lid member is provided on its periphery with at least two protrusions for welding which are formed by etching, said protrusions having a top, respectively, and being provided in such a manner that the tops of the protrusions are different in height from each other.

2. The hermetically sealable package as claimed in claim 1, wherein said protrusions are formed on an independently prepared protrusion member which is provided to the base member or lid member.

3. A hermetically sealable package for electronic component comprising a metallic base member and a metallic lid member, the metallic base member having lead wires penetrating therethrough under insulation, wherein the base member or lid member is provided on its periphery with a terraced protusion for welding.

4. The hermetically sealable package as claimed in claim 3, wherein said protrusions are formed on an independently prepared protrusion member which is provided to the base member or lid member.

5. The hermetically sealable package as claimed in claims 3, wherein at least two protrusions, each having a top, are provided in such a manner that the tops of the protrusions are different in height from each other.

* * * * *